(12) United States Patent
Hashimoto (10) Patent No.: US 11,438,000 B2
(45) Date of Patent: Sep. 6, 2022

(54) ATOMIC OSCILLATOR AND FREQUENCY SIGNAL GENERATION SYSTEM

(71) Applicant: Seiko Epson Corporation, Toyko (JP)

(72) Inventor: Yasuharu Hashimoto, Minamiminowa (JP)

(73) Assignee: Seiko Epson Corporation

(*) Notice: Subject to any disclaimer, the term of this patent is extended or adjusted under 35 U.S.C. 154(b) by 0 days.

(21) Appl. No.: 17/329,311

(22) Filed: May 25, 2021

(65) Prior Publication Data

US 2021/0376843 A1   Dec. 2, 2021

(30) Foreign Application Priority Data

May 26, 2020   (JP) .............................. JP2020-091440

(51) Int. Cl.
*H03L 7/26*   (2006.01)
(52) U.S. Cl.
CPC ...................... *H03L 7/26* (2013.01)
(58) Field of Classification Search
CPC ......................................................... H03L 7/26
USPC ......................................................... 331/94.1
See application file for complete search history.

(56) References Cited

U.S. PATENT DOCUMENTS

2015/0349790 A1*   12/2015   Maki ..................... H03L 7/26
                                                                 331/94.1
2018/0069560 A1*   3/2018   Tamura ................ G04F 5/145

FOREIGN PATENT DOCUMENTS

JP   2010-183323 A   8/2010
JP   2017-215226 A   12/2017

* cited by examiner

*Primary Examiner* — Joseph Chang
(74) *Attorney, Agent, or Firm* — Harness, Dickey & Pierce, P.L.C.

(57) ABSTRACT

An atomic oscillator including an oscillator that outputs an oscillation signal, a light emitter to which a signal based on the oscillation signal is inputted, an atomic cell, a light receiver that detects the light passing through the atomic cell and outputs a detection signal, a first temperature controller, and a control circuit, and the control circuit has a first mode including the process of operating the light emitter and the first temperature controller and the process of causing the oscillator to output the oscillation signal, a second mode including the process of causing the light emitter and the first temperature controller to stop operating and the process of causing the oscillator to stop outputting the oscillation signal, and a third mode including the process of causing the light emitter to stop operating, the process of operating the first temperature controller, and the process of causing the oscillator to stop outputting the oscillation signal.

6 Claims, 5 Drawing Sheets

| | LIGHT SOURCE TEMPERATURE ADJUSTMENT CIRCUIT | CELL TEMPERATURE ADJUSTMENT CIRCUIT | MAGNETIC FIELD CONTROL CIRCUIT | LIGHT SOURCE CONTROL CIRCUIT | POWER MANAGEMENT CIRCUIT | OSCILLATOR |
|---|---|---|---|---|---|---|
| NORMAL OPERATION MODE | A | A | A | A | A | A |
| SHORT-TERM STOP MODE | C | A | C | C | A | A |
| LONG-TERM STOP MODE | C | B | C | C | A | A |
| COMPLETE STOP MODE | C | C | C | C | C | C |

FIG. 5

ATOMIC OSCILLATOR AND FREQUENCY SIGNAL GENERATION SYSTEM

The present application is based on, and claims priority from JP Application Serial Number 2020-091440, filed May 26, 2020, the disclosure of which is hereby incorporated by reference herein in its entirety.

BACKGROUND

1. Technical Field

The present disclosure relates to an atomic oscillator and a frequency signal generation system.

2. Related Art

As an oscillator having high-precision oscillation characteristics over a long period of time, there is a known atomic oscillator that oscillates based on the energy transition of an alkali metal atom, such as cesium. The atomic oscillator includes a light emitter, an atomic cell that encapsulates an alkali metal atom, and a light receiver that detects light that passes through the atomic cell.

For example, JP-A-2010-183323 describes an atomic oscillator including a power-down generator that generates a signal indicating a power-down period and configured to power down an atomic resonator.

In JP-A-2010-183323, however, when the atomic resonator is powered down, gas cell temperature control is also terminated. When the gas cell temperature control is terminated, the temperature of the gas cell changes, so that it takes time to stabilize the characteristics of the atomic oscillator in the following operation period.

SUMMARY

An atomic oscillator according to an aspect of the present disclosure includes an oscillator that outputs an oscillation signal, a light emitter to which a signal based on the oscillation signal is inputted, an atomic cell that accommodates an alkali metal atom and light from the light emitter enters, a light receiver that detects the light passing through the atomic cell and outputs a detection signal, a first temperature controller that controls a temperature of the atomic cell, and a control circuit, and the control circuit has a first mode in which the control circuit carries out the process of operating the light emitter and the first temperature controller and the process of causing the oscillator to output the oscillation signal based on the detection signal, a second mode in which the control circuit carries out the process of causing the light emitter and the first temperature controller to stop operating and the process of causing the oscillator to stop outputting the oscillation signal, and a third mode in which the control circuit carries out the process of causing the light emitter to stop operating, the process of operating the first temperature controller, and the process of causing the oscillator to stop outputting the oscillation signal based on the detection signal.

A frequency signal generation system according to another aspect of the present disclosure includes an atomic oscillator and a processing circuit that outputs a signal that sets a mode of the atomic oscillator to any of a first mode, a second mode, and a third mode to the atomic oscillator. The atomic oscillator includes an oscillator that outputs an oscillation signal, a light emitter to which a signal based on the oscillation signal is inputted, an atomic cell that accommodates an alkali metal atom and light from the light emitter enters, a light receiver that detects the light passing through the atomic cell and outputs a detection signal, a first temperature controller that controls a temperature of the atomic cell, and a control circuit. The control circuit has a first mode in which the control circuit carries out the process of operating the light emitter and the first temperature controller and the process of causing the oscillator to output the oscillation signal based on the detection signal, a second mode in which the control circuit carries out the process of causing the light emitter and the first temperature controller to stop operating and the process of causing the oscillator to stop outputting the oscillation signal, and a third mode in which the control circuit carries out the process of causing the light emitter to stop operating, the process of operating the first temperature controller, and the process of causing the oscillator to stop outputting the oscillation signal based on the detection signal.

DESCRIPTION OF EXEMPLARY EMBODIMENTS

A preferable embodiment of the present disclosure will be described below in detail with reference to the drawings. It is not intended that the embodiment described below unduly limits the contents of the present disclosure set forth in the appended claims. Further, all configurations described below are not necessarily essential configuration requirements of the present disclosure.

1. Atomic Oscillator

1.1. Configuration

Figure 1:
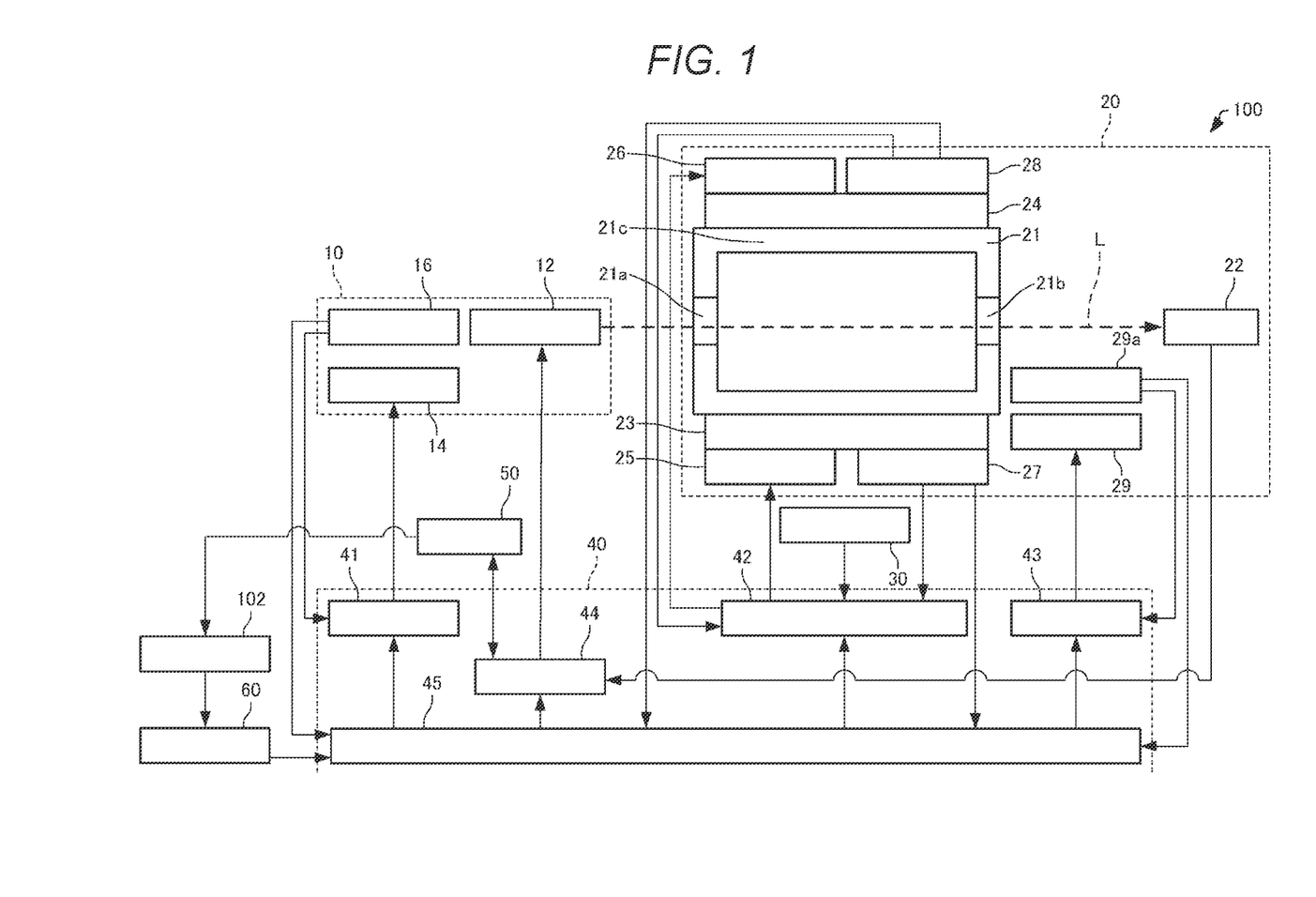
FIG. 1 is a block diagram showing an atomic oscillator according to an embodiment of the present disclosure.

An atomic oscillator according to the present embodiment will first be described with reference to the drawings. FIG. 1 is a block diagram showing an atomic oscillator 100 according to the present embodiment.

The atomic oscillator 100 is an atomic oscillator using a quantum interference effect (coherent population trapping: CPT) that produces a phenomenon in which an alkali metal atom irradiated with two types of resonance light having different specific wavelengths at the same time does not absorb but transmit the two types of resonance light. The phenomenon resulting from the quantum interference effect is also called an electromagnetically induced transparency (EIT) phenomenon. The atomic oscillator according to the present embodiment may instead be an atomic oscillator using a double resonance phenomenon based on light and microwaves.

The atomic oscillator 100 includes, for example, a light source unit 10, a cell unit 20, a temperature sensor 30, a control circuit 40, an oscillator 50, and an input terminal 60, as shown in FIG. 1.

The light source unit 10 includes, for example, a light emitter 12, a Peltier device 14, and a temperature sensor 16.

The light emitter 12 emits linearly polarized light L containing two types of light having different frequencies. A signal based on an oscillation signal from the oscillator 50 is inputted to the light emitter 12. Upon reception of the signal, the light emitter 12 emits the light L. The light emitter 12 is, for example, a vertical cavity surface emitting laser (VCSEL). The Peltier device 14 cools or heats the light emitter 12. The temperature sensor 16 detects the temperature of the light emitter 12. The temperature sensor 16 is, for example, a thermistor or a thermocouple.

The cell unit 20 includes, for example, an atomic cell 21, a light receiver 22, a high temperature metal 23, a low temperature metal 24, a heater 25, a Peltier device 26, temperature sensors 27 and 28, and a coil 29. The heater 25 is an example of a first temperature controller, and the Peltier device 26 is an example of a second temperature controller.

The light L from the light emitter 12 enters the atomic cell 21. The light L emitted from the light emitter 12 may enter the atomic cell 21 after passing through a light attenuation filter and a quarter wave plate that are not shown. The atomic cell 21 accommodates an alkali metal atom. The alkali metal atom has three-level-system energy levels formed of two ground levels different from each other and an excitation level. The alkali metal atom is, for example, cesium, rubidium, sodium, or potassium. The atomic cell 21 includes, for example, a light incident window 21a, a light exiting window 21b, and a wall 21c, which holds the light incident window 21a and the light exiting window 21b. The light L emitted from the light emitter 12 enters the atomic cell 21 via the light incident window 21a, impinges on the alkali metal atom, and exits via the light exiting window 21b.

The light receiver 22 receives the light L having passed through the atomic cell 21. The light receiver 22 detects the intensity of the light L having passed through the atomic cell 21 and outputs a detection signal according to the intensity of the light. The light receiver 22 is, for example, a photodiode (PD).

The high temperature metal 23 and the low temperature metal 24 are provided at the wall 21c of the atomic cell 21. The high temperature metal 23 and the low temperature metal 24 are so provided as to be separate from each other. Although not shown, the high temperature metal 23 may be so provided as to surround the light incident window 21a and the light exiting window 21b.

The heater 25 and the Peltier device 26 control the temperature of the atomic cell 21. The heater 25 is provided at the high temperature metal 23. The heater 25 heats the high temperature metal 23. The Peltier device 26 is provided at the low temperature metal 24. The Peltier device 26 heats or cools the low temperature metal 24.

The temperature sensor 27 is provided at the high temperature metal 23. The temperature sensor 27 detects the temperature of the high temperature metal 23. The temperature sensor 28 is provided at the low temperature metal 24. The temperature sensor 28 detects the temperature of the low temperature metal 24. The temperature sensors 27 and 28 are each, for example, a thermistor or a thermocouple.

The coil 29 is, for example, a solenoid-type coil so provided as to be wound along the outer circumference of the atomic cell 21 or a pair of Helmholtz-type coils facing each other via the atomic cell 21. The coil 29 generates a magnetic field in the atomic cell 21. The coil 29 enlarges the gap between different degenerated energy levels of the alkali metal atom accommodated in the atomic cell 21 based on Zeeman splitting to improve the resolution and reduce the linewidth of an EIT signal. In the illustrated example, the cell unit 20 includes a magnetic field sensor 29a. The magnetic field sensor 29a detects the magnetic field generated by the coil 29. The magnetic field sensor 29a may detect the magnetic field by measuring the current flowing through the coil 29.

The temperature sensor 30 is provided outside the cell unit 20. The temperature sensor 30 detects the temperature of the environment in which the cell unit 20 is provided. The temperature sensor 30 is, for example, a thermistor or a thermocouple.

The control circuit 40 is, for example, provided in an IC (integrated circuit) chip mounted on a substrate that is not shown. The control circuit 40 may be a single IC or the combination of a plurality of digital circuits or analog circuits.

The control circuit 40 includes, for example, a light source temperature adjustment circuit 41, a cell temperature adjustment circuit 42, a magnetic field control circuit 43, a light source control circuit 44, and a power management circuit 45.

The light source temperature adjustment circuit 41 controls the Peltier device 14 in such a way that the temperature detected by the temperature sensor 16 becomes a predetermined value.

The cell temperature adjustment circuit 42 controls the heater 25 in such a way that the temperature detected by the temperature sensor 27 becomes a predetermined value. The cell temperature adjustment circuit 42 further controls the Peltier device 26 in such a way that the temperature detected by the temperature sensor 28 becomes a predetermined value. The cell temperature adjustment circuit 42 controls the heater 25 and the Peltier device 26 in such a way that the temperature detected by the temperature sensor 27 is higher than the temperature detected by the temperature sensor 28. The high temperature metal 23 therefore has a temperature higher than the temperature of the low temperature metal 24. In the atomic cell 21, the saturated vapor pressure drops in a portion close to the low temperature metal 24, so that gaseous alkali metal atoms are likely to gather, and the gaseous alkali metal atoms having gathered come into contact with the wall 21c of the atomic cell 21 and form liquid. Therefore, the liquid alkali metal atoms are present in a portion close to the low temperature metal 24 of the atomic cell 21, and the gaseous alkali metal atoms are present in a portion close to the high temperature metal 23 of the atomic cell 21. Therefore, even when the gaseous alkali metal atoms, for example, react with the wall 21c of the atomic cell 21 and decrease accordingly, the presence of the gaseous and liquid alkali metal atoms in the atomic cell 21 allows the liquid alkali metal atoms to vaporize so that the concentration of the gaseous alkali metal atoms can be maintained constant. The oscillation frequency of the atomic oscillator 100 can thus be stabilized.

The cell temperature adjustment circuit 42 controls the heater 25 and the Peltier device 26 in such a way that the temperatures of the light incident window 21a and the light exiting window 21b of the atomic cell 21 are higher than the temperature of the wall 21c. Adherence of the liquid alkali metal atoms to the light incident window 21a and the light exiting window 21b can thus be suppressed.

The magnetic field control circuit 43 controls the coil 29 in such a way that the magnetic field detected by the magnetic field sensor 29a becomes a predetermined value.

The light source control circuit 44 causes the oscillator 50 to output an oscillation signal based on the detection signal outputted from the light receiver 22. Specifically, the light source control circuit 44 controls the oscillation frequency of the oscillator 50 based on the detection signal outputted from the light receiver 22 and uses the outputted oscillation signal to output a signal for controlling the light emitter 12. The light source control circuit 44 thus controls the frequencies of the two types of light contained in the light L emitted from the light emitter 12 in such a way that the EIT phenomenon occurs. The EIT phenomenon occurs when the two types of light contained in the light L form a resonant light pair having frequencies the difference between which corresponds to the energy difference between the two ground levels of the alkali metal atom accommodated in the atomic cell 21. The light source control circuit 44 controls the oscillator 50 to cause it to stabilize in synchronization with the control of the frequencies of the two types of light and causes the oscillator 50 to output the oscillation signal as a clock signal for the atomic oscillator 100.

The power management circuit 45 outputs signals to the light source temperature adjustment circuit 41, the cell temperature adjustment circuit 42, the magnetic field control circuit 43, and the light source control circuit 44 based, for example, on a signal outputted from a user terminal 102. The signal outputted from the user terminal 102 is a mode setting signal for setting the mode of the control circuit 40. The control circuit 40 has a normal operation mode, a short-term stop mode, a long-term stop mode, and a complete stop mode. The mode setting signal is a signal that sets the mode of the control circuit 40 to any of the normal operation mode, the short-term stop mode, the long-term stop mode, and the complete stop mode. The mode of the control circuit 40 will be described later.

The oscillator 50 outputs the oscillation signal. Specifically, the oscillator 50 outputs the oscillation signal to the user terminal 102. The oscillator 50 is, for example, an oscillator with a constant temperature oven (oven-controlled oscillator) or a voltage controlled oscillator (VCO). The oscillator with a constant temperature oven, in which the constant temperature oven can keep the temperature of the oscillator constant, can provide high precision.

The input terminal 60 accepts the mode setting signal from the user terminal 102 and transmits the accepted mode setting signal to the power management circuit 45. The input terminal 60 transmits the mode setting signal, for example, by using serial communication. The user terminal 102 is not accommodated in the atomic oscillator 100.

1.2. Processes Carried Out by Control Circuit

Figure 2:
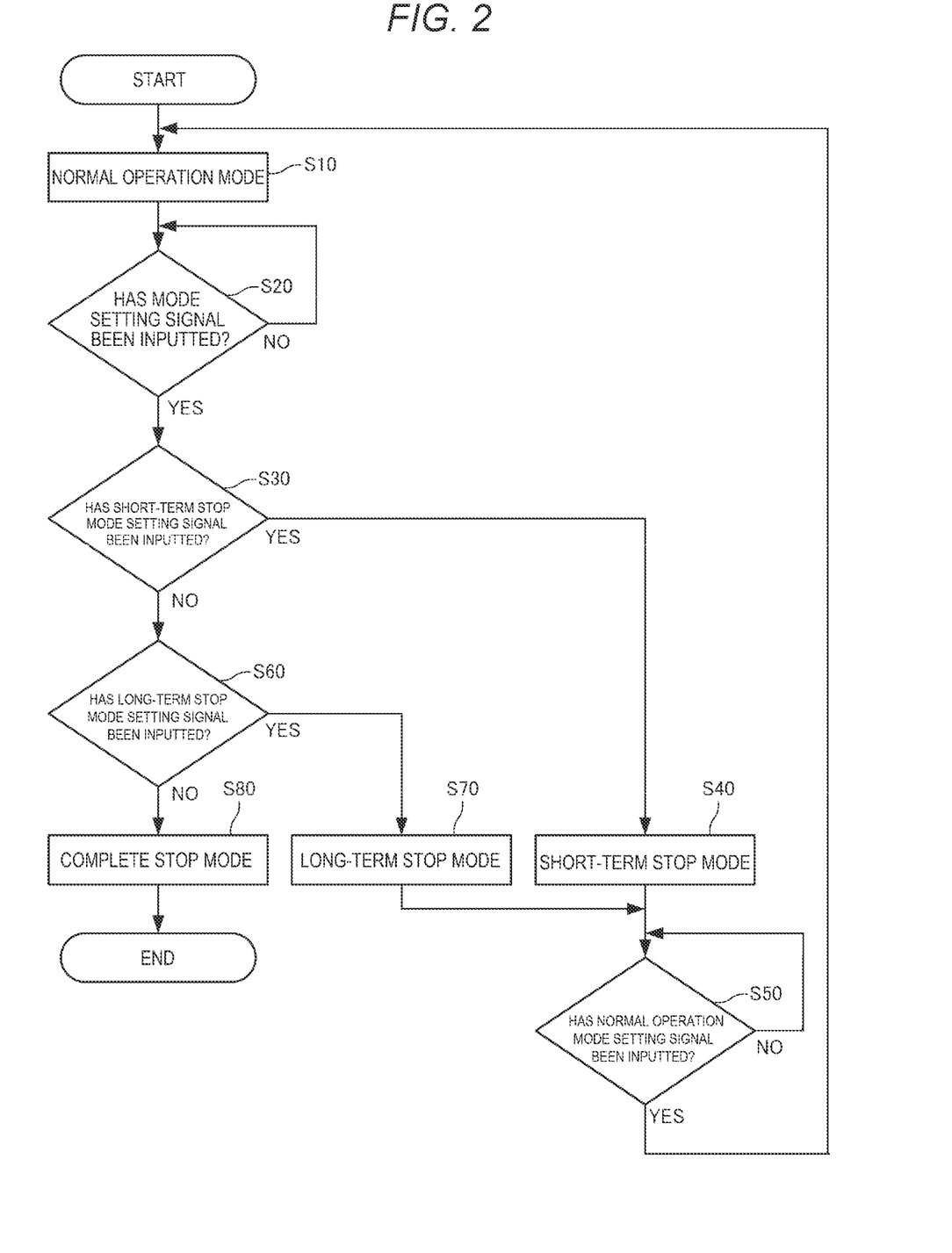
FIG. 2 is a flowchart for describing processes carried out by a control circuit of the atomic oscillator according to the present embodiment.

Processes carried out by the control circuit 40 of the atomic oscillator 100 will next be described with reference to the drawings. FIG. 2 is a flowchart for describing the processes carried out by the control circuit 40.

Figure 3:
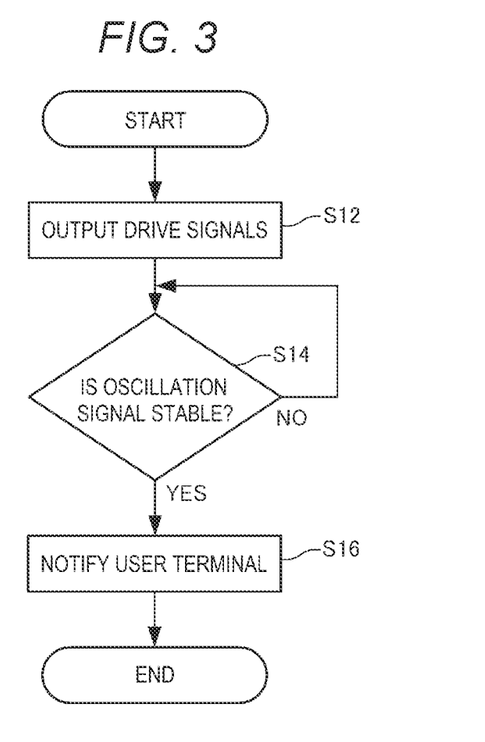
FIG. 3 is a flowchart for describing the processes carried out by the control circuit of the atomic oscillator according to the present embodiment.

The control circuit 40 starts carrying out the processes when the atomic oscillator 100 is powered on. First, the control circuit 40 carries out processes in the normal operation mode (step S10), as shown in FIG. 2. FIG. 3 is a flowchart for describing the processes in the normal operation mode of the control circuit 40.

In the normal operation mode, the control circuit 40 carries out the process of operating the light emitter 12, the Peltier devices 14, 26, the heater 25, and the coil 29 and the process of causing the oscillator 50 to output the oscillation signal based on the detection signal from the light receiver 22.

Specifically, the power management circuit 45 outputs drive signals to the light source temperature adjustment circuit 41, the cell temperature adjustment circuit 42, the magnetic field control circuit 43, and the light source control circuit 44 (step S12), as shown in FIG. 3. In response to the drive signal from the power management circuit 45, the light source temperature adjustment circuit 41 is driven and operates the Peltier device 14. The cell temperature adjustment circuit 42 is driven and operates the heater 25 and the Peltier device 26. The magnetic field control circuit 43 is driven and operates the coil 29. The light source control circuit 44 is driven and operates the light emitter 12. Further, the light source control circuit 44 causes the oscillator 50 to output the oscillation signal based on the detection signal from the light receiver 22.

The power management circuit 45 then evaluates whether or not the oscillation signal outputted from the oscillator 50 is stable based on results from the temperature sensors 16, 27, 28, the magnetic field sensor 29a, the period having elapsed since the atomic oscillator 100 was powered on, and other pieces of information (step S14). When the result of the evaluation shows that the oscillation signal outputted from the oscillator 50 is stable ("YES" in step S14), the power management circuit 45 notifies the user terminal 102 that the operation of the atomic oscillator 100 is stable (step S16). A user can thus know that the frequency of the atomic oscillator 100 has original precision. On the other hand, when the result of the evaluation shows that the oscillation signal outputted from the oscillator 50 is not stable ("NO" in step S14), the power management circuit 45 waits until the oscillation signal outputted from the oscillator 50 becomes stable. The control circuit 40 then terminates the processes in the normal operation mode.

The power management circuit 45 then waits until the mode setting signal is inputted from the user terminal 102 ("NO" in step S20), and when the result of the evaluation shows that the mode setting signal has been inputted from the user terminal 102 via the input terminal 60 ("YES" in step S20), the power management circuit 45 evaluates whether or not the inputted mode setting signal is a short-term stop mode setting signal (step S30), as shown in FIG. 2.

The evaluation process in step S30 may be carried out in two steps. For example, when the short-term stop mode setting signal is inputted to the power management circuit 45 and then the short-term stop mode setting signal is inputted to the power management circuit 45 again, the power management circuit 45 determines that the inputted mode setting signal is the short-term stop mode setting signal. For example, when the short-term stop mode setting signal is inputted for the first time and a long-term stop mode setting signal is inputted for the second time, the power management circuit 45 returns from the process in step S30 to the process in step S20. Carrying out the evaluation process in step S30 in two steps can prevent the mode from being changed due to the user's erroneous operation.

Figure 4:
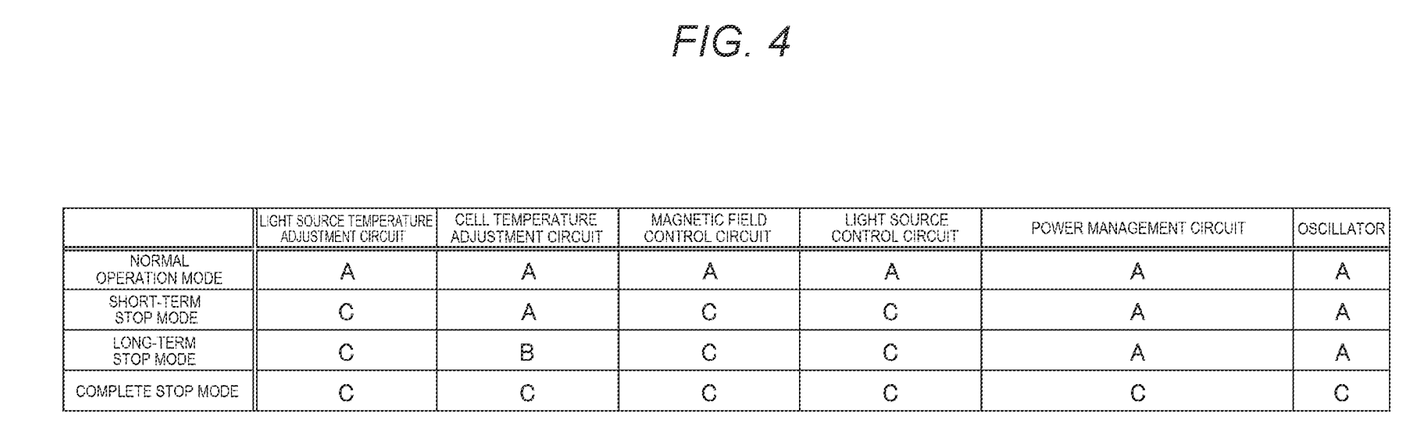
FIG. 4 is a table showing the driven states of circuits and an oscillator in each mode of the atomic oscillator according to the present embodiment.

When the result of the evaluation shows that the mode setting signal inputted in step S30 is the short-term stop mode setting signal ("YES" in step S30), the control circuit 40 carries out the processes in the short-term stop mode (step S40). FIG. 4 is a table showing the driven states of the circuits and the oscillator 50 in each of the modes of the atomic oscillator 100. In FIG. 4, "A" represents that the circuits and the oscillator 50 are driven, "C" represents that the circuits and the oscillator 50 are stopped, and "B" represents that the circuits and the oscillator 50 are driven with power consumption being lower than in "A".

In the short-term stop mode, the control circuit 40 carries out the process of causing the light emitter 12, the Peltier device 14, and the coil 29 to stop operating, carrying out causing the oscillator 50 to stop outputting the oscillation signal based on the detection signal from the light receiver 22, and the process of operating the heater 25 and the Peltier device 26, as shown in FIG. 4.

Specifically, in the short-term stop mode, the power management circuit 45 outputs a stop signal to the light source temperature adjustment circuit 41, the magnetic field control circuit 43, and the light source control circuit 44. As a result, the light source temperature adjustment circuit 41 stops operating, and the light emitter 12 and the Peltier element 14 stop operating. Further, the magnetic field control circuit 43 stops operating, and the coil 29 stops operating. Upon acceptance of the stop signal, the light source control circuit 44 carries out the process of keeping the voltage applied to the oscillator 50 equal to the voltage at the time when the stop signal is accepted. The light source control circuit 44 then stops operating. As a result, the output of the oscillation signal from the oscillator 50 based on the detection signal from the light receiver 22 is stopped. However, since the voltage at the time of the acceptance of the stop signal is applied to the oscillator 50, the oscillator 50 outputs an oscillation signal that is not based on the detection signal from the light receiver 22. The user can thus use an oscillation signal that is not based on the detection signal from the light receiver 22.

The power management circuit 45 does not output the stop signal to the cell temperature adjustment circuit 42. The cell temperature adjustment circuit 42 therefore operates the heater 25 and the Peltier device 26 in the same manner as in the normal operation mode. The cell temperature adjustment circuit 42 controls the temperatures of the heater 25 and the Peltier device 26 so as to be equal to the temperatures of the heater 25 and the Peltier device 26 in the normal operation mode, respectively.

Thereafter, the power management circuit 45 waits until a normal operation mode setting signal is inputted via the user terminal 102 ("NO" in step S50), and when the result of the evaluation shows that the normal operation mode setting signal has been inputted ("YES" in step S50), the power management circuit 45 returns to the process in step S10, as shown in FIG. 2.

When the result of the evaluation shows that the mode setting signal inputted in step S30 is not the short-term stop mode setting signal ("NO" in step S30), the power management circuit 45 evaluates whether or not the inputted mode setting signal is the long-term stop mode setting signal (step S60), as shown in FIG. 2.

When the result of the evaluation shows that the mode setting signal inputted in step S60 is the long-term stop mode setting signal ("YES" in step S60), the control circuit 40 carries out processes in the long-term stop mode (step S70). The evaluation process in step S60 may be carried out in two steps, as in the evaluation process in step S30 described above.

Specifically, the control circuit 40 carries out the process of causing the light emitter 12, the Peltier device 14, and the coil 29 to stop operating and the process of operating the heater 25 and the Peltier device 26, as shown in FIG. 4, as in the case of the processes in the short-term stop mode (step S40) described above.

Further, the power management circuit 45 outputs a signal to the cell temperature adjustment circuit 42. Having received the signal, the cell temperature adjustment circuit 42 controls the temperatures of the heater 25 and the Peltier device 26 in the long-term stop mode so as to be lower than the temperatures of the heater 25 and the Peltier device 26 in the normal operation mode, respectively. The cell temperature adjustment circuit 42 controls the relationship in terms of magnitude between the temperature of the heater 25 and the temperature of the Peltier device 26 in the long-term stop mode so as to be the same as the relationship in terms of magnitude between the temperature of the heater 25 and the temperature of the Peltier device 26 in the normal operation mode.

Specifically, the cell temperature adjustment circuit 42 having received the signal from the power management circuit 45 lowers the temperatures of the heater 25 and the Peltier device 26 while keeping the result of subtraction of the temperature detected by the temperature sensor 28 from the temperature detected by the temperature sensor 27 (hereinafter also referred to as "difference in temperature of atomic cell 21") equal to a predetermined value. The difference in the temperature of the atomic cells 21 is, for example, about 5° C. More specifically, the cell temperature adjustment circuit 42 lowers the temperatures of the heater 25 and the Peltier device 26 while keeping the difference in the temperature of the atomic cell 21 at the predetermined value until the temperature detected by the temperature sensor 28 becomes the temperature detected by the temperature sensor 30. Since the temperature detected by the temperature sensor 30 is the environmental temperature, the temperature of the Peltier device 26 becomes the environmental temperature. The cell temperature adjustment circuit 42 then causes the Peltier device 26 to stop operating.

As described above, in the long-term stop mode, the difference in the temperature of the atomic cell 21 is maintained even when the Peltier device 26 is caused to stop operating. The distribution of the alkali metal atom in the atomic cell 21 can be made close to the distribution in the normal operation mode as compared with a case where the temperature difference is not maintained. Therefore, when the processes in the normal operation mode (step S10) are carried out again, the period required to stabilize the operation of the atomic oscillator 100 can be shortened.

The control circuit 40 then moves to the process in step S50, as shown in FIG. 2.

In the long-term stop mode, the light source control circuit 44 may cause the light emitter 12 to emit the light in the middle of the operation of lowering the temperatures of the heater 25 and the Peltier device 26. The light source control circuit 44 may store the magnitude of the detection signal outputted from the light receiver 22 and based on the light in a storage that is not shown. Thereafter, when the control circuit 40 carries out the process in step S10 again, the cell temperature adjustment circuit 42 may operate the heater 25 and the Peltier device 26 based on the detection signal magnitude stored in the storage. For example, when the detection signal magnitude stored in the storage is smaller than a predetermined value, the cell temperature adjustment circuit 42 may operate the heater 25 and the Peltier device 26 in such a way that the difference in the temperature of the atomic cells 21 is greater than 5° C. Therefore, in the processes in the normal operation mode (step S10), the period required to stabilize the operation of the atomic oscillator 100 can be shortened.

When the result of the evaluation shows that the mode setting signal inputted in step S60 is not the long-term stop mode setting signal ("NO" in step S60), the control circuit 40 carries out processes in the complete stop mode (step S80).

Specifically, the control circuit 40 carries out the process of causing the light emitter 12, the Peltier device 14, and the coil 29 to stop operating, the process of causing the heater 25 and the Peltier device 26 to stop operating, the process of causing the oscillator 50 to stop outputting the oscillation signal, as shown in FIG. 4, as in the short-term stop mode described above.

More specifically, the power management circuit 45 outputs the stop signal to the light source temperature adjustment circuit 41, the cell temperature adjustment circuit 42, the magnetic field control circuit 43, and the light source control circuit 44. As a result, the light source temperature adjustment circuit 41, cell temperature adjustment circuit 42, the magnetic field control circuit 43, and the light source control circuit 44 stop operating, and the light emitter 12, the Peltier devices 14, 26, the heater 25, the coil 29, and the oscillator 50 stop operating. The control circuit 40 then terminates the processes.

To stop the heater 25 and the Peltier device 26, it is preferable to gradually lower the magnitude of the outputs from the heater 25 and the Peltier device 26 to cause the heater 25 and the Peltier device 26 to stop operating while keeping the difference in the temperature of the atomic cell 21 equal to the predetermined value, as in the long-term stop mode described above. The distribution of the alkali metal atom in the atomic cell 21 can thus be made close to the distribution in the normal operation mode as compared with the case where the temperature difference is not maintained, and when the processes in the normal operation mode (step S10) are carried out again, the period required to stabilize the operation of the atomic oscillator 100 can be shortened.

The light source control circuit 44 may store the magnitude of the detection signal from the light receiver 22 in the storage in the middle of the operation of lowering the temperatures of the heater 25 and the Peltier device 26, as in the long-term stop mode described above.

It is also preferable to operate the heater 25 and the Peltier device 26 in step S10 by gradually increasing the magnitude of the outputs of the heater 25 and the Peltier device 26 while keeping the difference in the temperature of the atomic cell 21 equal to the predetermined value.

1.3. Effects and Advantages

In the atomic oscillator 100, the control circuit 40 has the normal operation mode, the complete stop mode, the short-term stop mode, and the long-term stop mode. In the normal operation mode, the control circuit 40 carries out the process of operating the light emitter 12 and the heater 25 and the process of causing the oscillator 50 to output the oscillation signal based on the detection signal from the light receiver 22. In the complete stop mode, the control circuit 40 carries out the process of causing the light emitter 12 and the heater 25 to stop operating and the process of causing the oscillator 50 to stop outputting the oscillation signal. In the short-term stop mode and the long-term stop mode, the control circuit 40 carries out the process of causing the light emitter 12 to stop operating, the process of operating the heater 25, and the process of causing the oscillator 50 to stop outputting the oscillation signal based on the detection signal from the light receiver 22.

Therefore, in the short-term stop mode and the long-term stop mode, the atomic oscillator 100 with a temperature distribution formed in the atomic cell 21 can cause the light emitter 12 to stop operating and the oscillator 50 to stop outputting the oscillation signal based on the detection signal from the light receiver 22. Therefore, when the processes in the normal operation mode are next carried out with the power consumption lowered, the period required to stabilize the characteristics of the atomic oscillator can be shortened. The normal operation mode is a first mode, the complete stop mode is a second mode, and the short-term stop mode and the long-term stop mode are each a third mode.

In the atomic oscillator 100, the control circuit 40 controls the temperature of the heater 25 in the short-term stop mode so as to be equal to the temperature of the heater 25 in the normal operation mode. As a result, in the atomic oscillator 100, the temperature distribution in the atomic cell 21 in the short-term stop mode can be made close to the temperature distribution in the atomic cell 21 in the normal operation mode, as compared, for example, with a case where the temperature of the heater in the short-term stop mode is so controlled as to be lower than the temperature of the heater in the normal operation mode.

In the atomic oscillator 100, the control circuit 40 controls the temperature of the heater 25 in the long-term stop mode so as to be lower than the temperature of the heater 25 in the normal operation mode. As a result, the atomic oscillator 100 allows reduction in power consumption as compared, for example, with a case where the temperature of the heater in the long-term stop mode is so controlled as to be equal to the temperature of the heater in the normal operation mode.

In the atomic oscillator 100, the control circuit 40 controls the relationship in terms of magnitude between the temperature of the heater 25 and the temperature of the Peltier device 26 in the long-term stop mode so as to be the same as the relationship in terms of magnitude between the temperature of the heater 25 and the temperature of the Peltier device 26 in the normal operation mode. As a result, in the atomic oscillator 100, the temperature distribution in the atomic cell 21 in the long-term stop mode can be made close to the temperature distribution in the atomic cell 21 in the normal operation mode as compared with a case where the relationship in terms of magnitude between the temperature of the heater and the temperature of the Peltier device in the long-term stop mode differs from the relationship in terms of magnitude between the temperature of the heater and the temperature of the Peltier device in the normal operation mode.

The atomic oscillator 100 includes the input terminal 60, which accepts the mode setting signal, which sets the mode of the control circuit 40 to any of the normal operation mode, the short-term stop mode, the long-term stop mode, and the complete stop mode. The atomic oscillator 100 can therefore accept the mode setting signal from the user terminal 102 via the input terminal 60 and transmit the accepted mode setting signal to the power management circuit 45.

2. Variations

The atomic oscillator according to a variation of the present embodiment will next be described.

The control circuit 40 has been described above with reference to the case where the normal operation mode is performed after the long-term stop mode, and the control circuit 40 may instead perform the complete stop mode after the long-term stop mode. Still instead, the control circuit 40 may perform the complete stop mode after the short-term stop mode.

Further, the above description has been made of the case where the oscillator 50 outputs an oscillation signal that is not based on the detection signal from the light receiver 22 in the long-term stop mode. In the long-term stop mode, however, the light source control circuit 44 may stop outputting the oscillation signal from the oscillator 50. In this case, the user may obtain the clock signal from an external oscillator.

Further, the above description has been made of the case where the heater 25 is provided as the first temperature controller and the Peltier device 26 is provided as the second temperature controller, and both the first and second temperature controllers are each a Peltier device or both the first and second temperature controllers may each be a heater. As long as the first temperature controller is provided, the second temperature controller may not be provided.

3. Frequency Signal Generation System

Figure 5:
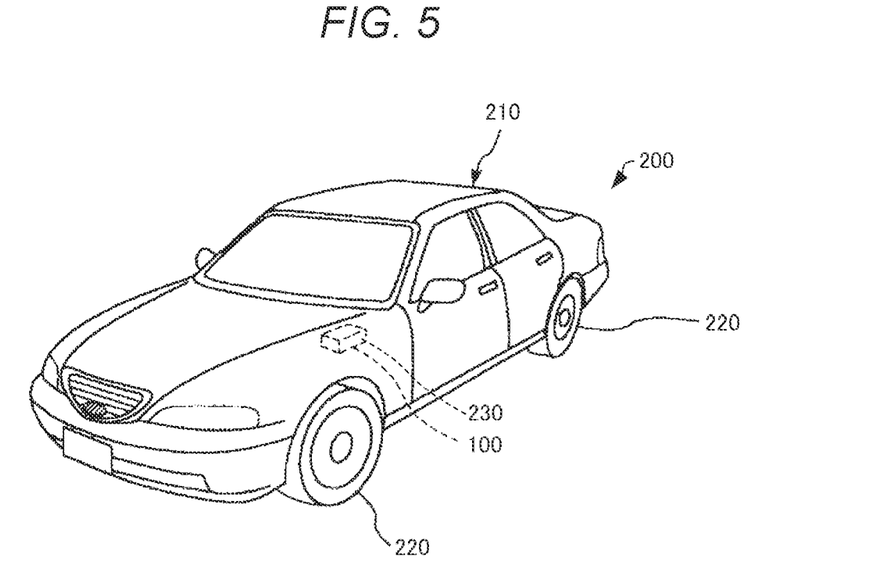
FIG. 5 describes an automobile according to the present embodiment.

A frequency signal generation system according to the present embodiment will next be described with reference to the drawings. An automobile including the atomic oscillator 100 will be described below as the frequency signal generation system according to the present embodiment. FIG. 5 describes an automobile 200 according to the present embodiment.

The automobile 200 includes a vehicle body 210 and four wheels 220, and a power source (engine) that is not shown but is provided in the vehicle body 210 is configured to rotate the wheels 220, as shown in FIG. 5. The automobile 200 has the atomic oscillator 100 and a processing circuit 230 built therein. The processing circuit 230 outputs a mode setting signal for setting the mode to the atomic oscillator 100. The processing circuit 230 may be a single IC or the combination of a plurality of digital circuits or analog circuits.

The automobile 200 includes the atomic oscillator 100 and the processing circuit 230, which outputs the mode setting signal for setting the mode to the atomic oscillator 100. The automobile 200 can therefore obtain a high-precision clock signal while reducing power consumption by repeating the short-term stop mode and the normal operation mode at fixed time intervals during the travel. Further, the automobile 200 can further reduce the power consumption by causing the atomic oscillator 100 to operate in the long-term stop mode when the vehicle is not in motion and causing the atomic oscillator 100 to transition to the complete stop mode when the vehicle is not in motion for a long period.

The frequency signal generation system according to the present embodiment may not be used in an automobile but may be a clock transmission system as a timing server. In this case, required temporal precision can be maintained with power consumption reduced, for example, by repeating the short-term stop mode and the normal operation mode at fixed time intervals during the period for which GPS (Global Positioning System) or the like cannot support the frequency signal generation and causing the atomic oscillator 100 to operate in the long-term stop mode during the period for which the frequency signal generation can be supported.

The embodiment and variations described above are presented by way of example, and the present disclosure is not limited thereto. For example, the embodiment and variations can be combined with each other as appropriate.

The present disclosure encompasses substantially the same configuration as the configuration described in the embodiment, for example, a configuration having the same function, using the same method, and providing the same result or a configuration having the same purpose and providing the same effect. Further, the present disclosure encompasses a configuration in which an inessential portion of the configuration described in the embodiment is replaced. Moreover, the present disclosure encompasses a configuration that provides the same effects and advantages as those provided by the configuration described in the embodiment or a configuration that can achieve the same purpose as that achieved by the configuration described in the embodiment. Further, the present disclosure encompasses a configuration in which a known technology is added to the configuration described in the embodiment.

The following contents are derived from the embodiment described above.

One aspect of an atomic oscillator includes an oscillator that outputs an oscillation signal, a light emitter to which a signal based on the oscillation signal is inputted, an atomic cell that accommodates an alkali metal atom and light from the light emitter enters, a light receiver that detects the light passing through the atomic cell and outputs a detection signal, a first temperature controller that controls the temperature of the atomic cell, and a control circuit, and the control circuit has a first mode in which the control circuit carries out the process of operating the light emitter and the first temperature controller and the process of causing the oscillator to output the oscillation signal based on the detection signal, a second mode in which the control circuit carries out the process of causing the light emitter and the first temperature controller to stop operating and the process of causing the oscillator to stop outputting the oscillation signal, and a third mode in which the control circuit carries out the process of causing the light emitter to stop operating, the process of operating the first temperature controller, and the process of causing the oscillator to stop outputting the oscillation signal based on the detection signal.

The thus configured atomic oscillator operating in the third mode with a temperature distribution formed in the atomic cell can cause the light emitter to stop operating and the oscillator to stop outputting the oscillation signal based on the detection signal from the light receiver. Therefore, when the processes in the first mode are next carried out with the power consumption lowered, the period required to stabilize the characteristics of the atomic oscillator can be shortened.

In the aspect of the atomic oscillator, the control circuit may control the temperature of the first temperature controller in the third mode so as to be equal to the temperature of the first temperature controller in the first mode.

According to the atomic oscillator described above, the temperature distribution in the atomic cell in the third mode can be made close to the temperature distribution in the atomic cell in the first mode, as compared, for example, with the case where the temperature of the first temperature controller in the third mode is so controlled as to be lower than the temperature of the first temperature controller in the first mode.

In the aspect of the atomic oscillator, the control circuit may control the temperature of the first temperature controller in the third mode so as to be lower than the temperature of the first temperature controller in the first mode.

The atomic oscillator described above allows reduction in power consumption as compared, for example, with the case where the temperature of the first temperature controller in the third mode is so controlled as to be equal to the temperature of the first temperature controller in the first mode.

In the aspect of the atomic oscillator, the atomic oscillator may further include a second temperature controller that controls the temperature of the atomic cell, and the control circuit may control the relationship in terms of magnitude between the temperature of the first temperature controller and the temperature of the second temperature controller in the third mode so as to be the same as the relationship in terms of magnitude between the temperature of the first temperature controller and the temperature of the second temperature controller in the first mode.

According to the atomic oscillator described above, the temperature distribution in the atomic cell in the third mode can be made close to the temperature distribution in the atomic cell in the first mode as compared with the case where the relationship in terms of magnitude between the temperature of the first temperature controller and the temperature of the second temperature controller in the third mode differs from the relationship in terms of magnitude between the temperature of the first temperature controller and the temperature of the second temperature controller in the first mode.

In the aspect of the atomic oscillator, the atomic oscillator may include an input terminal via which a signal that sets the mode of the control circuit to any of the first mode, the second mode, and the third mode is accepted.

The thus configured atomic oscillator can accept a mode setting signal from a user terminal via the input terminal and transmit the accepted mode setting signal to the control circuit.

One aspect of a frequency signal generation system includes an atomic oscillator and a processing circuit that outputs a signal that sets the mode of the atomic oscillator to any of a first mode, a second mode, and a third mode to the atomic oscillator. The atomic oscillator includes an oscillator that outputs an oscillation signal, a light emitter to which a signal based on the oscillation signal is inputted, an atomic cell that accommodates an alkali metal atom and light from the light emitter enters, a light receiver that detects the light passing through the atomic cell and outputs a detection signal, a first temperature controller that controls the temperature of the atomic cell, and a control circuit. The control circuit has a first mode in which the control circuit carries out the process of operating the light emitter and the first temperature controller and the process of causing the oscillator to output the oscillation signal based on the detection signal, a second mode in which the control circuit carries out the process of causing the light emitter and the first temperature controller to stop operating and the process of causing the oscillator to stop outputting the oscillation signal, and a third mode in which the control circuit carries out the process of causing the light emitter to stop operating, the process of operating the first temperature controller, and the process of causing the oscillator to stop outputting the oscillation signal based on the detection signal.

What is claimed is:

1. An atomic oscillator comprising:
an oscillator that outputs an oscillation signal;
a light emitter to which a signal based on the oscillation signal is inputted;
an atomic cell that accommodates an alkali metal atom and light from the light emitter enters;
a light receiver that detects the light passing through the atomic cell and outputs a detection signal;
a first temperature controller that controls a temperature of the atomic cell; and
a control circuit,
wherein the control circuit has
a first mode in which the control circuit carries out the process of operating the light emitter and the first temperature controller and the process of causing the oscillator to output the oscillation signal based on the detection signal,
a second mode in which the control circuit carries out the process of causing the light emitter and the first temperature controller to stop operating and the process of causing the oscillator to stop outputting the oscillation signal, and
a third mode in which the control circuit carries out the process of causing the light emitter to stop operating, the process of operating the first temperature controller, and the process of causing the oscillator to stop outputting the oscillation signal based on the detection signal.

2. The atomic oscillator according to claim 1,
wherein the control circuit controls a temperature of the first temperature controller in the third mode so as to be equal to the temperature of the first temperature controller in the first mode.

3. The atomic oscillator according to claim 1,
wherein the control circuit controls a temperature of the first temperature controller in the third mode so as to be lower than the temperature of the first temperature controller in the first mode.

4. The atomic oscillator according to claim 3,
further comprising a second temperature controller that controls the temperature of the atomic cell,
wherein the control circuit controls a relationship in terms of magnitude between the temperature of the first temperature controller and a temperature of the second temperature controller in the third mode so as to be the same as the relationship in terms of magnitude between the temperature of the first temperature controller and the temperature of the second temperature controller in the first mode.

5. The atomic oscillator according to claim 1,
further comprising an input terminal via which a signal that sets the mode of the control circuit to any of the first mode, the second mode, and the third mode is accepted.

6. A frequency signal generation system comprising:
an atomic oscillator; and
a processing circuit that outputs a signal that sets a mode of the atomic oscillator to any of a first mode, a second mode, and a third mode to the atomic oscillator,
wherein the atomic oscillator includes
an oscillator that outputs an oscillation signal,
a light emitter to which a signal based on the oscillation signal is inputted,
an atomic cell that accommodates an alkali metal atom and light from the light emitter enters,
a light receiver that detects the light passing through the atomic cell and outputs a detection signal,
a first temperature controller that controls a temperature of the atomic cell, and
a control circuit, and
the control circuit has
a first mode in which the control circuit carries out the process of operating the light emitter and the first temperature controller and the process of causing the oscillator to output the oscillation signal based on the detection signal,
a second mode in which the control circuit carries out the process of causing the light emitter and the first temperature controller to stop operating and the process of causing the oscillator to stop outputting the oscillation signal, and
a third mode in which the control circuit carries out the process of causing the light emitter to stop operating, the process of operating the first temperature controller, and the process of causing the oscillator to stop outputting the oscillation signal based on the detection signal.

* * * * *